United States Patent
Wei et al.

(10) Patent No.: US 12,506,076 B2
(45) Date of Patent: Dec. 23, 2025

(54) POWER RAIL BETWEEN FINS OF A TRANSISTOR STRUCTURE

(71) Applicant: Intel Corporation, Santa Clara, CA (US)

(72) Inventors: Andy Chih-Hung Wei, Yamhill, OR (US); Guillaume Bouche, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 894 days.

(21) Appl. No.: 17/359,434

(22) Filed: Jun. 25, 2021

(65) Prior Publication Data

US 2022/0415796 A1 Dec. 29, 2022

(51) Int. Cl.
*H01L 23/528* (2006.01)
*H01L 21/308* (2006.01)
*H10D 84/01* (2025.01)
*H10D 84/03* (2025.01)
*H10D 84/85* (2025.01)

(52) U.S. Cl.
CPC ........ *H01L 23/5286* (2013.01); *H01L 21/308* (2013.01); *H10D 84/0186* (2025.01); *H10D 84/0193* (2025.01); *H10D 84/038* (2025.01); *H10D 84/853* (2025.01)

(58) Field of Classification Search
CPC ............... H01L 23/5286; H01L 21/308; H01L 21/823821; H01L 21/823871; H01L 27/0924; H01L 21/823814; H01L 21/76895; H01L 23/485; H01L 21/743; H01L 23/535; H01L 23/481; H01L 23/482; H01L 29/785
See application file for complete search history.

(56) References Cited

U.S. PATENT DOCUMENTS

| 2020/0105603 | A1  | 4/2020 | Chang  |             |
|--------------|-----|--------|--------|-------------|
| 2020/0135578 | A1* | 4/2020 | Ching  | H01L 21/743 |
| 2020/0135634 | A1* | 4/2020 | Chiang | H01L 21/76897 |
| 2020/0135724 | A1  | 4/2020 | Lin    |             |
| 2021/0305130 | A1* | 9/2021 | Cho    | H10B 10/12  |

OTHER PUBLICATIONS

Partial European Search Report from European Patent Application No. 22180477.6 mailed Dec. 8, 2022, 14 pgs.
Extended European Search Report from European Patent Application No. 22180477.6 mailed Mar. 15, 2023, 12 pgs.

* cited by examiner

*Primary Examiner* — Fernando L Toledo
*Assistant Examiner* — Adam S Bowen
(74) *Attorney, Agent, or Firm* — Schwabe, Williamson & Wyatt P.C.

(57) ABSTRACT

Embodiments described herein may be related to apparatuses, processes, and techniques related to a transistor structure that includes a buried power rail (BPR) located within the transistor structure at a level below a height of one or more of the fins of the transistor structure. The BPR may be located proximate to a bottom substrate of the transistor structure. In embodiments, the transistor structure includes a protective layer, which can include one or more dielectric layers, above the BPR to protect the BPR during stages of transistor structure manufacture. In embodiments, portions of the protective layer may also be used to constrain epitaxial growth during stages of manufacturing of the transistor structure. Other embodiments may be described and/or claimed.

20 Claims, 16 Drawing Sheets

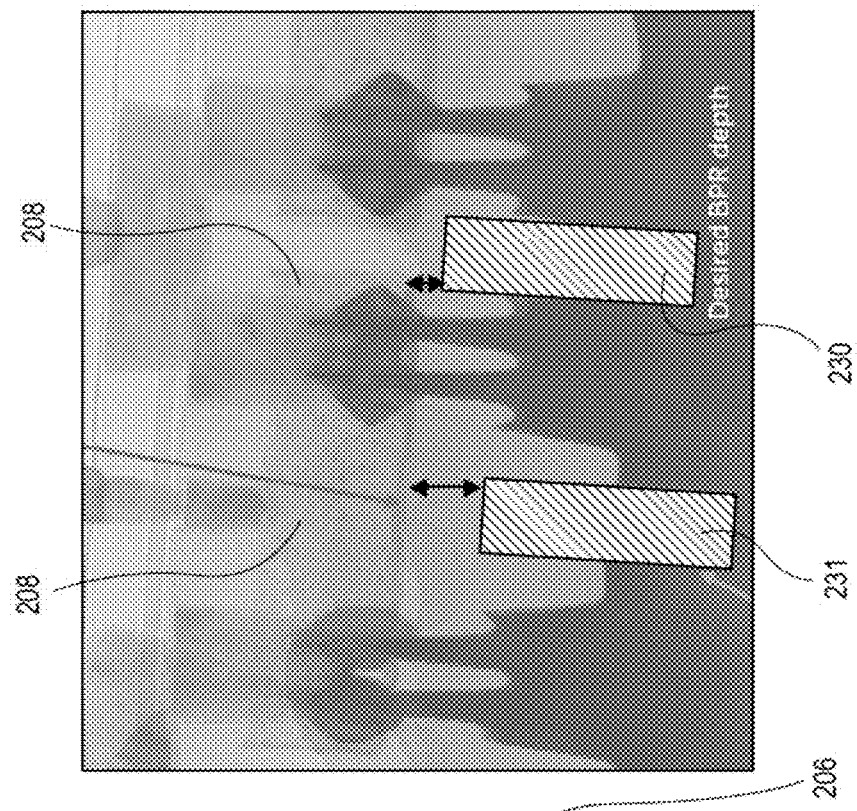
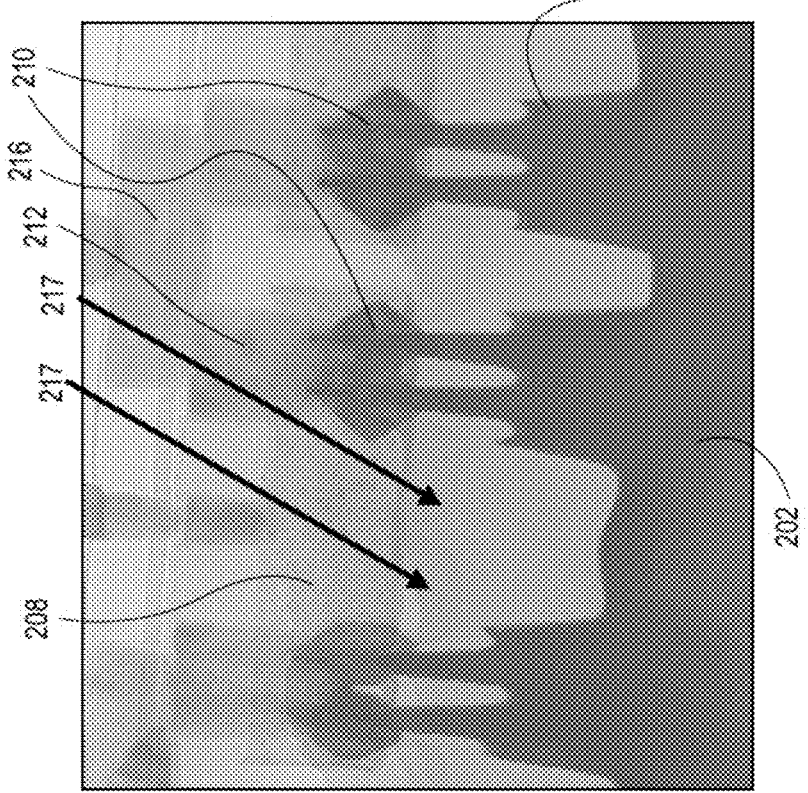
FIG. 2B
FIG. 2A

POWER RAIL BETWEEN FINS OF A TRANSISTOR STRUCTURE

FIELD

Embodiments of the present disclosure generally relate to the field of semiconductor packaging, and in particular to power rail placement within a transistor structure.

BACKGROUND

The increased adoption of mobile computing devices will continue to drive increased logic transistor density requirements in integrated circuits.

BRIEF DESCRIPTION OF THE DRAWINGS

FIG. 2A-2B illustrate a prior art cross-section of a transistor structure, and a cross section of a transistor structure with various locations for a BPR within the transistor structure, in accordance with various embodiments.

DETAILED DESCRIPTION

Figure 1:
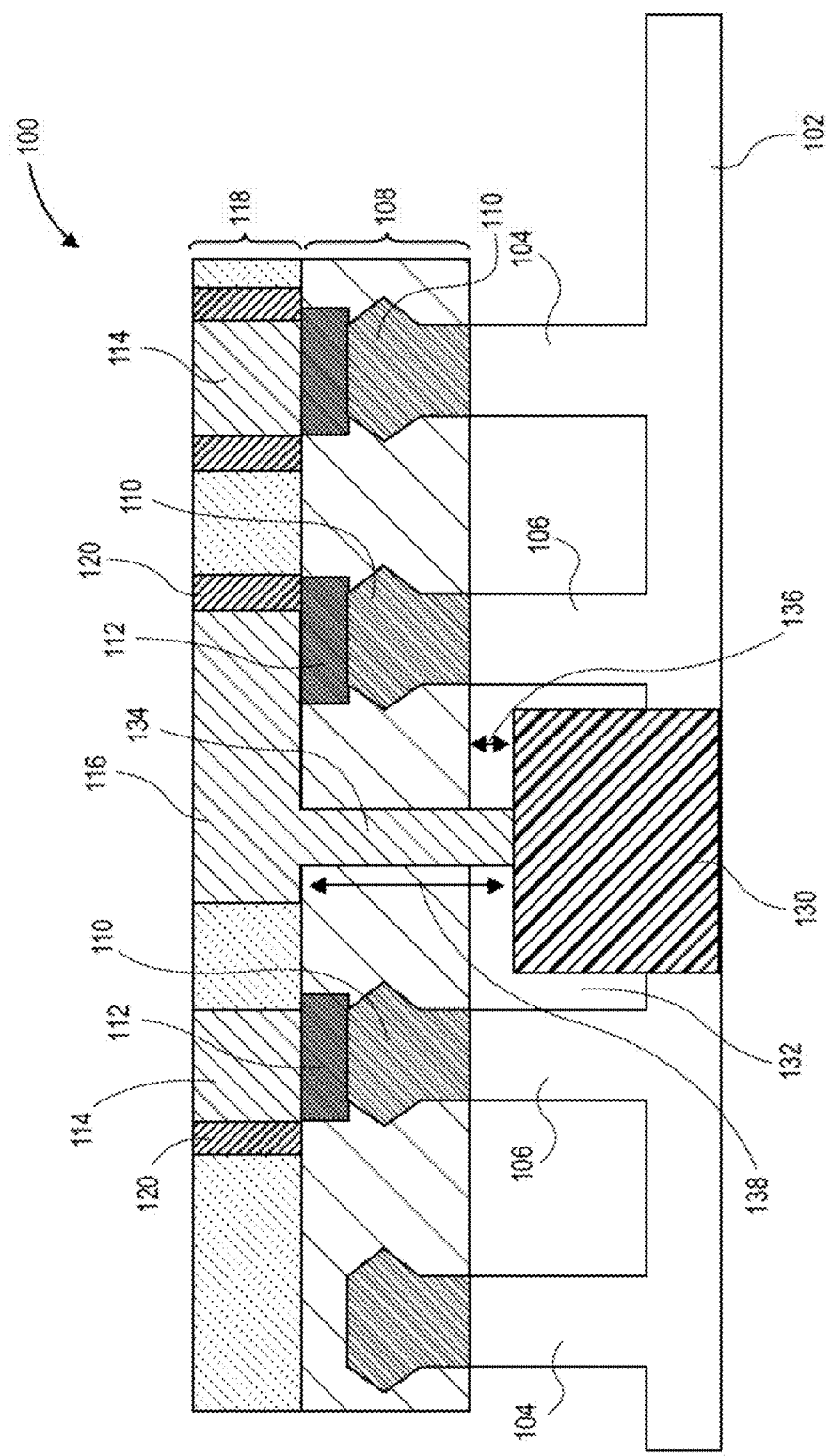
FIG. 1 illustrates a cross-section of a buried power rail (BPR) within a transistor structure, in accordance with various embodiments.

Embodiments described herein may be related to apparatuses, processes, and techniques directed to a transistor structure that includes a buried power rail (BPR) located within the transistor structure at a level below a height of one or more of the fins of the transistor structure. In embodiments, the BPR may be located between the fins of the transistor structure, proximate to a bottom substrate of the transistor structure. In embodiments, the transistor structure includes a protective layer, which can include one or more dielectric layers, above the BPR to protect the BPR during stages of manufacturing of the transistor structure. In embodiments, portions of the protective layer may also be used to constrain epitaxial growth, for example for NMOS epitaxy or PMOS epitaxy, during stages of manufacturing of the transistor structure. In embodiments, the NMOS epitaxy may be referred to as a phosphorus-doped epitaxy or SiP epitaxy, and the PMOS epitaxy may be referred to as a silicon germanium epitaxy or SiGe epitaxy.

In embodiments, a flow of the stages of manufacturing of the transistor structure may simultaneously confine the epitaxial growth of a gate all around (GAA) source/drain, and protect the BPR from exposure during the epitaxial preclean process. In embodiments, a capping layer may be formed on top of the first sidewall spacer stack. This capping layer keeps the bottom of the first sidewall spacer stack in place, and protects the BPR from exposure during the preclean process. In embodiments, the flow of the stages of manufacturing will cap the BPR as a part of the integrated flow, and may use thin films deposited to provide epitaxial confinement during the source/drain fabrication process.

A BPR that is formed prior to transistor formation must not be exposed during the front end of line (FEOL) fabrication process, otherwise the BPR may be damaged, or metal contamination may occur. Some metals, for instance copper, are known to generate defects within silicon transistors if the metals are diffused in the silicon crystal lattice. Fabrication processes, such as a front-end-of-line (FEOL) process or a back-end-of-line (BEOL) process which may also be known as a copper back end process, typically take place sequentially and in involve separate sections of a manufacturing plant to avoid metallic contamination. Embodiments described herein are directed to changes within these processes to prevent contamination of the BPR during manufacture, involving one or more protective layers above the BPR.

In addition GAA devices at a scaled diffusion to diffusion space require confinement of the source/drain epitaxy. Also, the BPR may require a minimum height via, which may also be referred to as a conductive via, to electrically couple the BPR with other parts of the transistor structure, in order to reduce the resistance penalty due to a lengthy conductive via. In addition, embodiments should enable variability control of the length of the conductive via, for example that the length should be immune to isolating oxide erosion from the epitaxial preclean process.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 illustrates a cross-section of a buried power rail (BPR) within a transistor structure, in accordance with various embodiments. Transistor structure diagram 100 shows a layer 102 that is coupled with a plurality of transistor fins 104, 106 that extend into a metal gate 108. In embodiments epitaxial layers 110 may be grown onto the fins 104, 106 in between the multiple metal gates (not shown) that may be similar to metal gate 108. A first set of trench connectors 112 may couple with a second set of trench connectors 114, 116 within an oxide layer 118. In embodiments the second set of trench connectors 114, 116 may be separated by spacers 120. A buried power rail (BPR) 130 is located between the fins 106, and below the metal gate 108. In embodiments, an oxide 132 may surround the BPR 130. This may also be referred to as the BPR 130 buried within shallow trench isolation (STI).

A through via 134 may electrically couple with one of the second set of trench connectors 116. The through via 134 may also be referred to as a conductive via 134. In other embodiments, the through via 134 may be a bus-like structure (not shown) that extends along a top of the BPR 130 along multiple metal gates 108. In such embodiments, the bus like structure may include dielectrics (not shown) or other electrical separation features along the bus like structure to prevent individual metal gates 108 from becoming electrically coupled.

During transistor structure 100 design and manufacturing, a first distance 136 between the BPR 130 and a bottom of the metal gate 108, as well as a second distance 138 between the BPR 130 and a bottom of one of the second set of trench connectors 116 are important. In embodiments, the first distance 136, which may be through an oxide material, needs to be large enough to electrically isolate the BPR 130 from the gate 108. In addition, the second distance 138, in embodiments, should be small enough to prevent excessive resistance losses between the BPR 130 and the TCN 116. In embodiments, a nominal first distance 136 could be set in the range 5 nm to 30 nm, or more narrowly in the range 10 nm to 20 nm, so that the nominal first distance 136 may be minimized while allowing isolation even in a worst case of process variation. Similarly, a nominal second distance 138 could be set in the range of 50 nm to 100 nm, or more narrowly between 70 nm and 80 nm.

Note that in embodiments, the layer 102 may be part of or maybe coupled with a substrate layer (not shown). In embodiments, the substrate layer (not shown), the layer 102, and the fins 104, 106 may include silicon. Note also that the cross-section shown in transistor structure 100 is a cross-section taken through a trench between metal gates. It should be appreciated that there may be one or more metal gate 108 structures going into or coming out of corresponding planes parallel to the plane shown in FIG. 1, where the one or more metal gate 108 structures are separated by trenches in which source and drain epitaxy are grown over the fins.

FIG. 2A-2B illustrate a prior art cross-section of a transistor structure, and a cross section of a transistor structure with various locations for a BPR within the transistor structure, in accordance with various embodiments. FIG. 2A-2B show a cross-section of a transistor structure, which may be similar to transistor structure 100 of FIG. 1. FIG. 2A-2B show fins 206, gate 208, epitaxies 210, first trench connectors 212, and second trench connectors 216, which may be similar to fins 106, gate 108, epitaxies 110, first trench connectors 112 and second trench connectors 116 of FIG. 1.

As shown, during creation of the legacy transistor structure using an epitaxy spacer process, there is an STI loss 217 that results from the epitaxy preclean processes. As a result as shown in FIG. 2B, in legacy implementations, the the epitaxy preclean may cause a BPR 231, which may be similar to BPR 130 of FIG. 1, to be pushed lower away from a bottom of the gate 208 and into substrate 202. In embodiments, the BPR 230, which may be similar to BPR 130 of FIG. 1, is positioned closer to a bottom of the gate 208 while still being electrically isolated from the gate 208.

Figure 3:
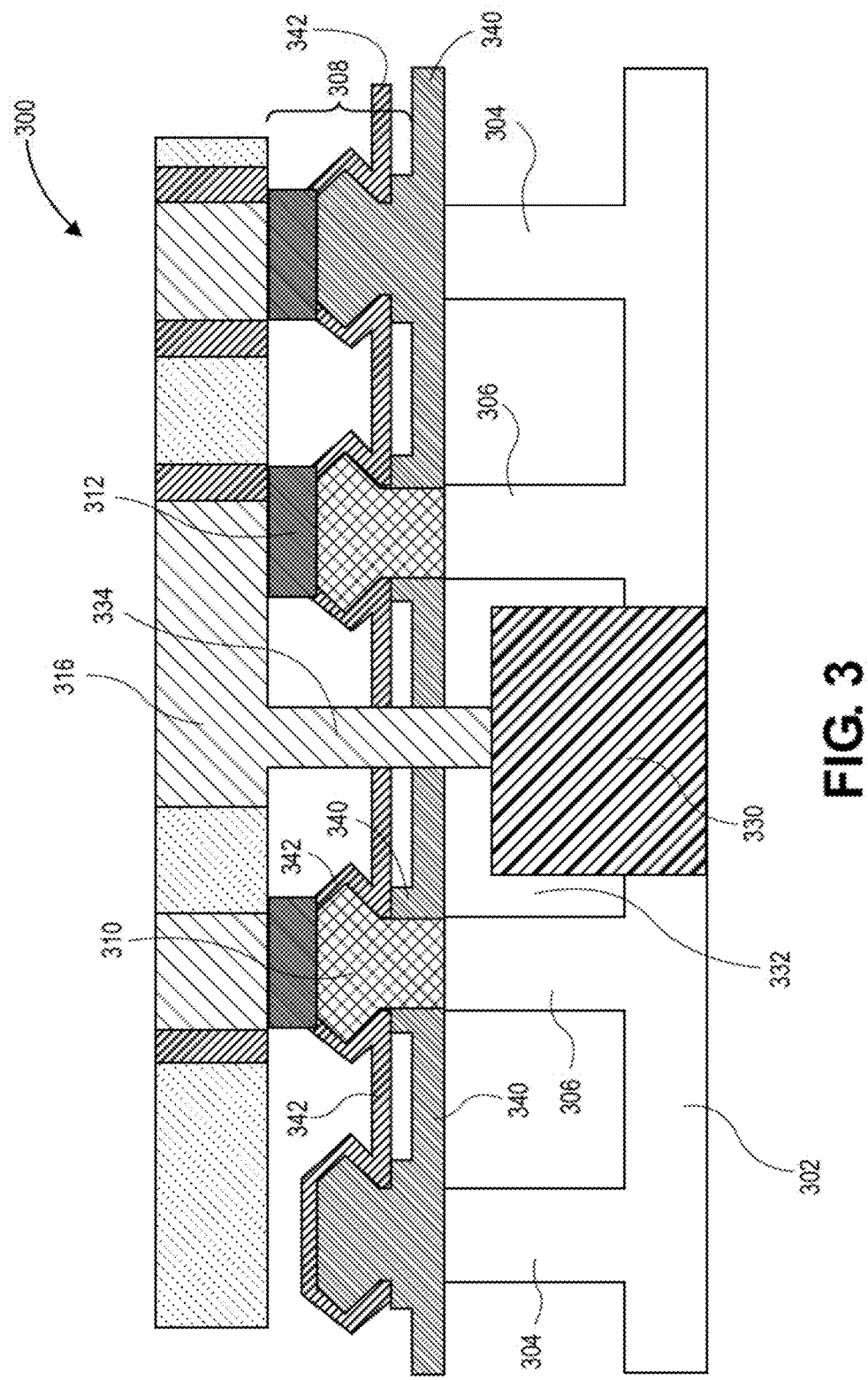
FIG. 3 illustrates a cross-section diagram of a BPR with a protective layer to protect the BPR during stages of manufacturing, in accordance with various embodiments.

FIG. 3 illustrates a cross-section diagram of a BPR with a protective layer to protect the BPR during stages of manufacturing, in accordance with various embodiments. Transistor structure 300, which may be similar to transistor structure 100 of FIG. 1, and includes a layer 302, fins 304, 306, epitaxy 310, BPR 330, conductive via 334, and second trench connector 316, which may be similar to layer 102, fins 104, 106, epitaxy 110, BPR 130, conductive via 134, and second trench connector 116 of FIG. 1. Note also that an oxide 332 may surround the BPR 330 and may also be located between the fins 304, 306. In embodiments, the conductive via 334 may be made of a low resistivity metal including Ruthenium and Molybdenum. In embodiments, the lateral distance between two fins 304, or between two fins 306, or between a fin 304 and a fin 306 may be no larger than 28 nm.

In embodiments, a barrier layer 340 may be placed on top of the oxide layer 332. In embodiments, this barrier layer 340 will protect the metal structure of the BPR 330 during the manufacturing stages of the epitaxy 310. Without the barrier layer 340, the BPR 330 would be subjected to damage during the epitaxy clean process and other processes that may expose the unprotected BPR 330 to damage. In addition, during manufacture, a contact etch stop layer (CESL) 342, as described further below, may be applied above the barrier layer 340.

In embodiments, subsequent to the epitaxy clean process, and/or other transistor structure 300 manufacturing stages, the conductive via 334 is created to electrically couple the BPR 330 with the top trench connector 316. The conductive via 334 will break through the barrier layer 340 and the CESL 342 to create the electrical coupling with the BPR 330.

In embodiments with respect to the barrier layer 340, part of the barrier layer 340 may extend at least partially up the sides of the epitaxy 310 that is grown at the top of the one or more fins 304, 306. In embodiments, these parts of the barrier layer 340 will serve to constrain the growth of the crystals during epitaxy 310 formation. In embodiments, constraining the growth of the crystals adds the benefit of allowing fins 304, 306 to be positioned closer together without the epitaxies 310 coming into direct contact with each other. In addition, there are benefits to constraining the growth of crystals with respect to desired compression or tensile characteristics of the channel to alter the mobility of carriers in the channel of the device. For instance, an static random access memory (SRAM) cell may benefit from having a weak PMOS transistor, and processing a constrained SiGe epitaxy resulting in a smaller epitaxy volume and accordingly less strain in the PMOS channel will therefore benefit the SRAM. In embodiments, the CESL 342 may partially surround the epitaxy 310.

Figure 4A:
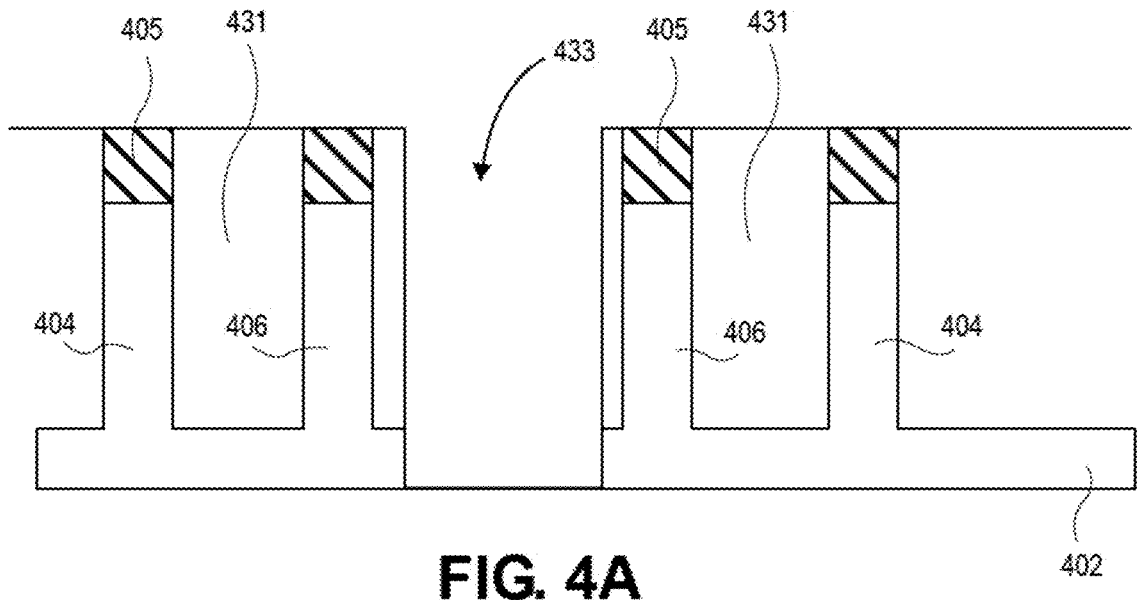
FIGS. 4A-4T illustrate various manufacturing stages for a BPR within a transistor structure that includes a protective layer to protect the BPR and to constrain growth of epitaxy, in accordance with various embodiments.
Figure 4B:
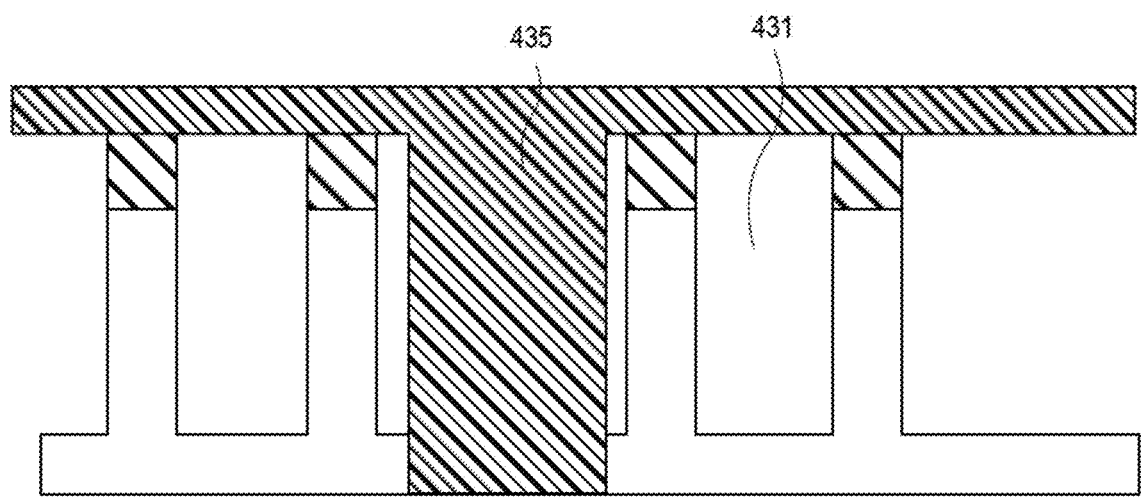
Figure 4C:
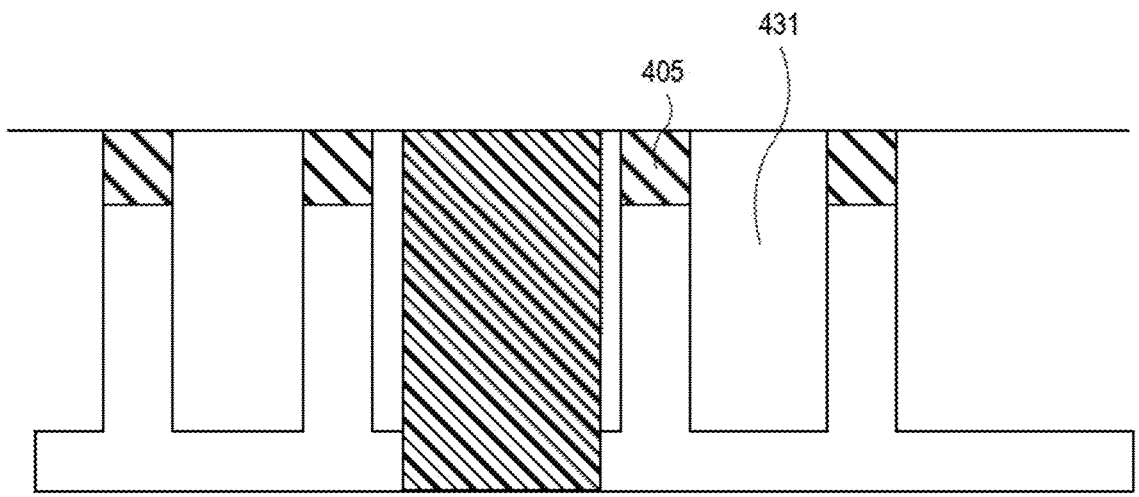
Figure 4D:
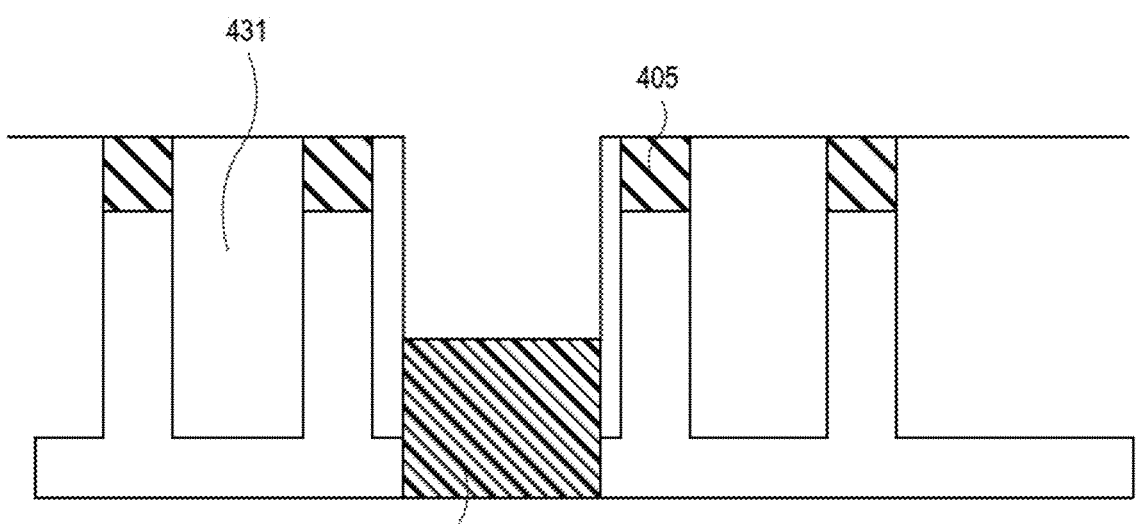
Figure 4E:
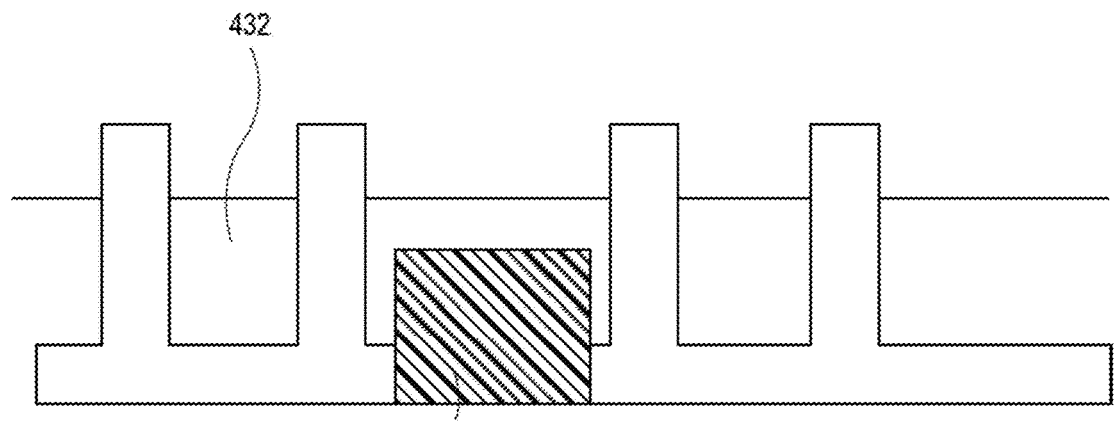
Figure 4F:
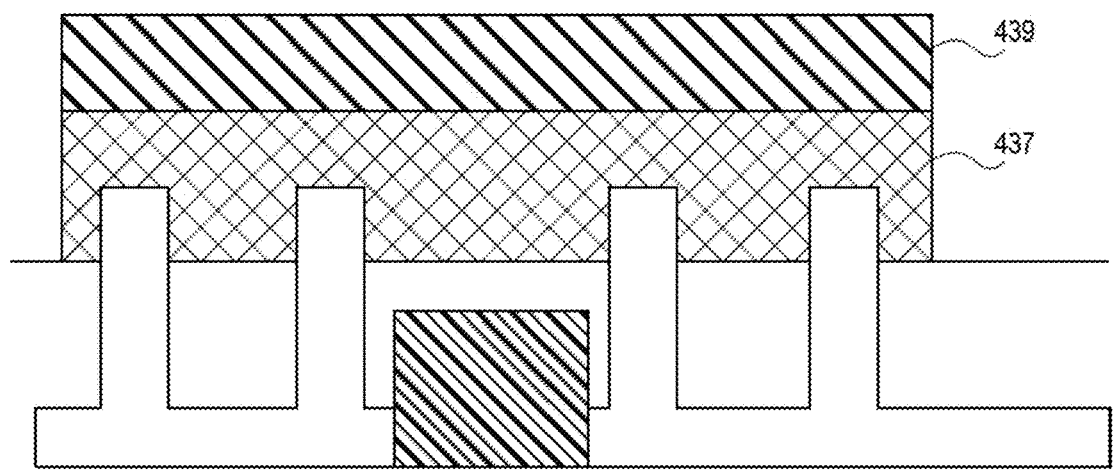
Figure 4G:
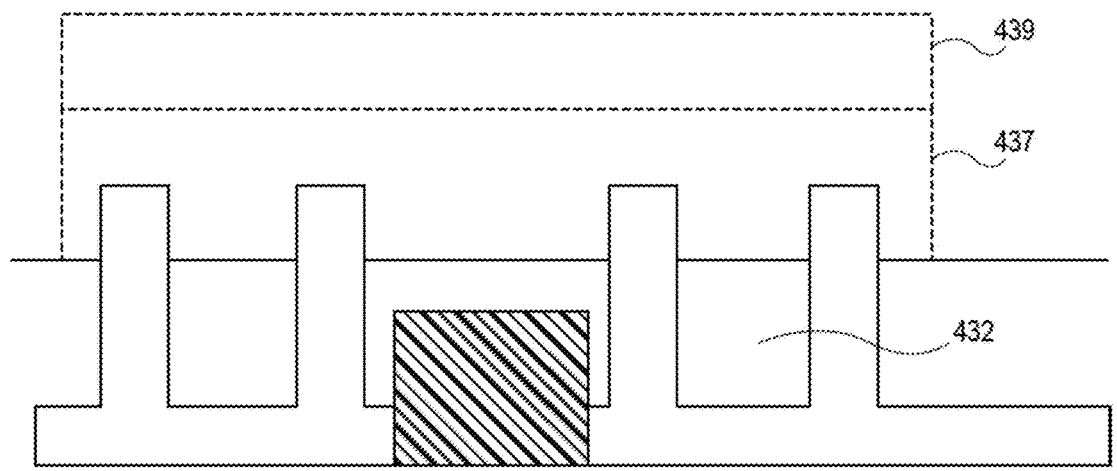
Figure 4H:
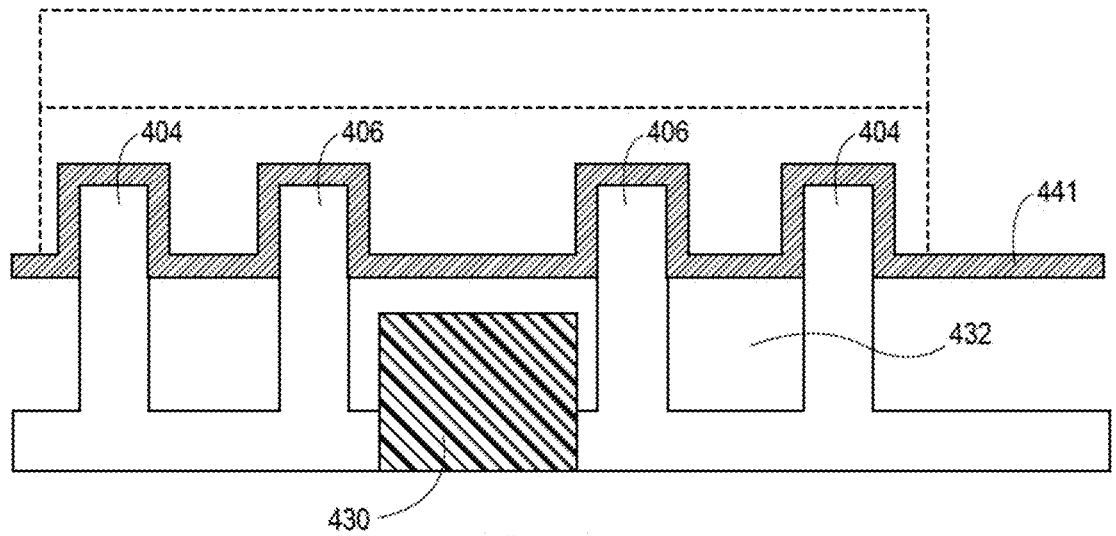
Figure 4I:
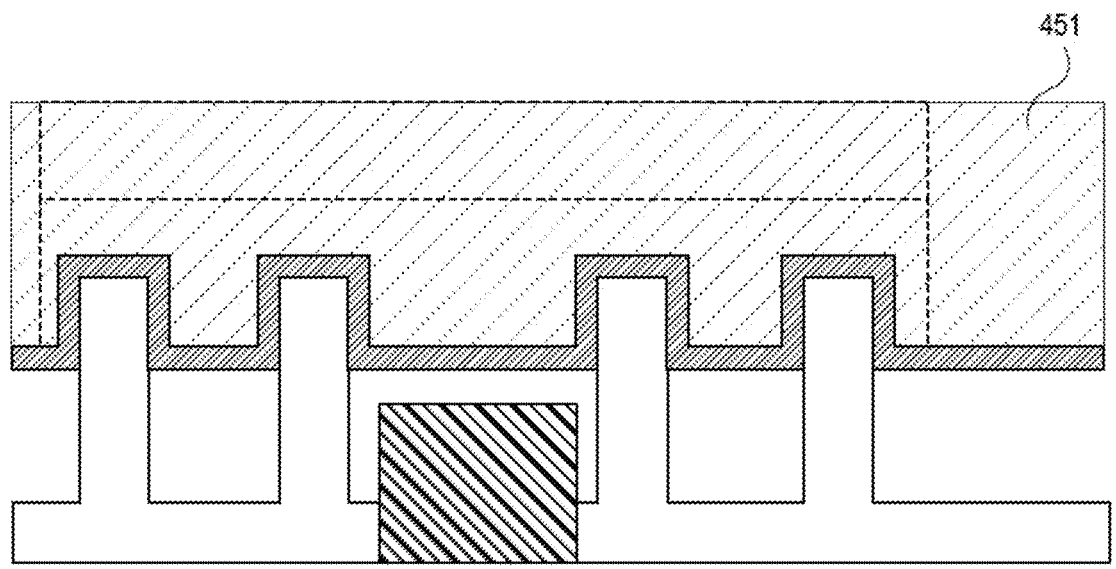
Figure 4J:
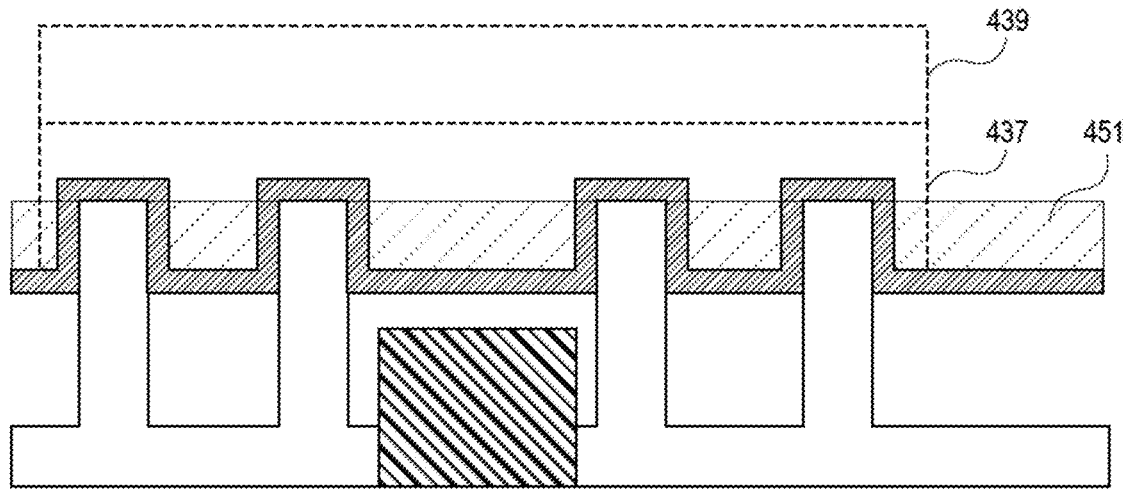
Figure 4K:
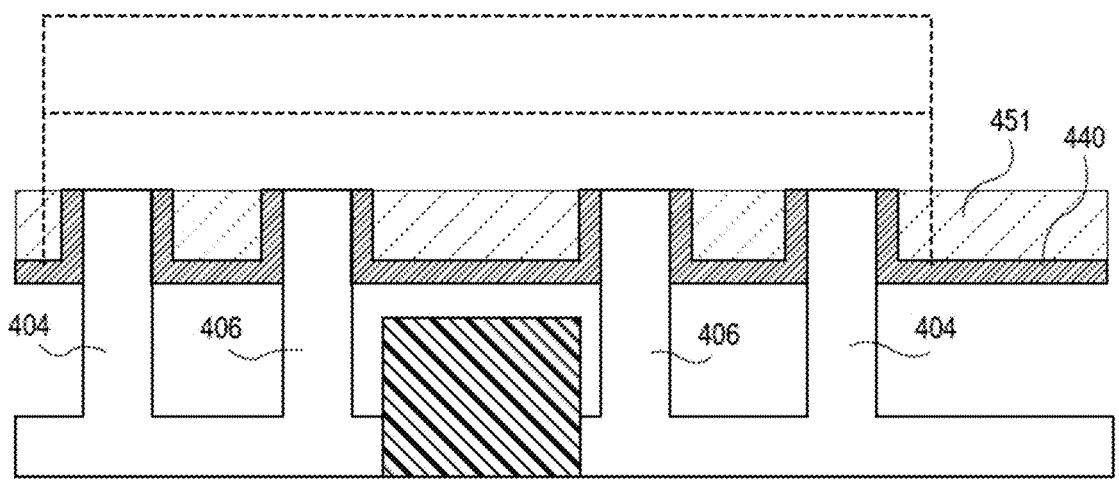
Figure 4L:
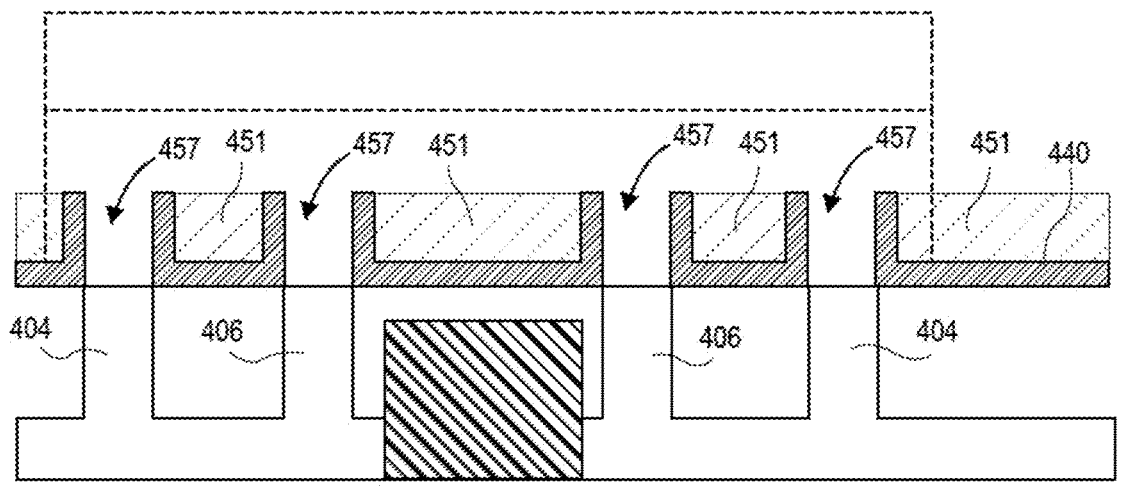
Figure 4M:
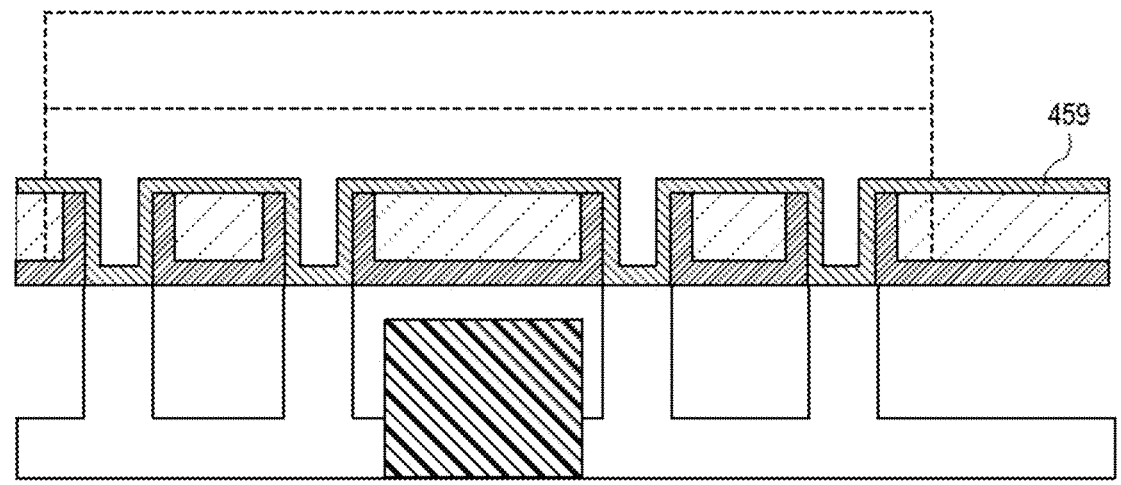
Figure 4N:
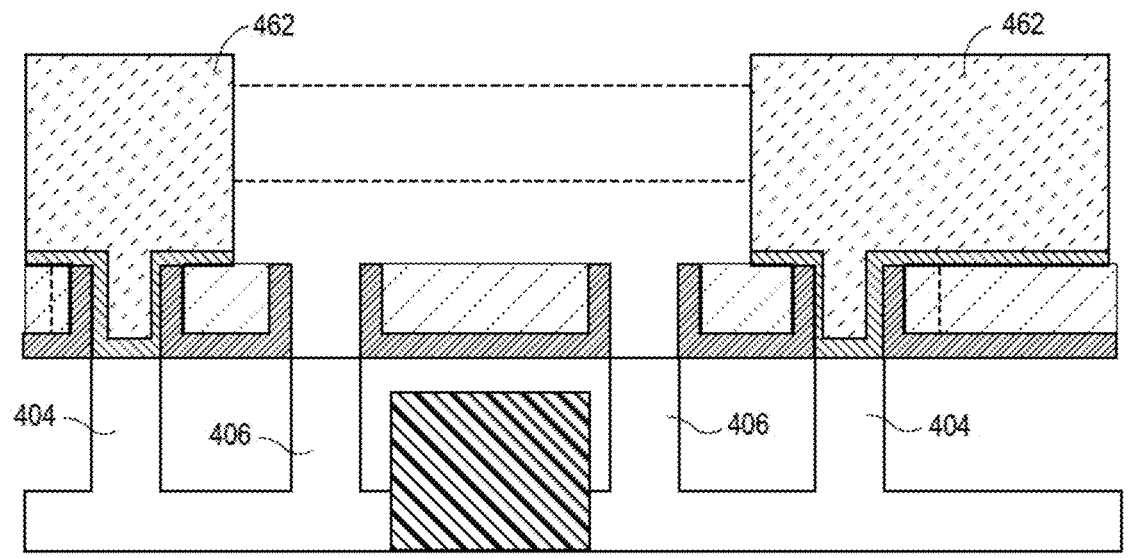
Figure 4O:
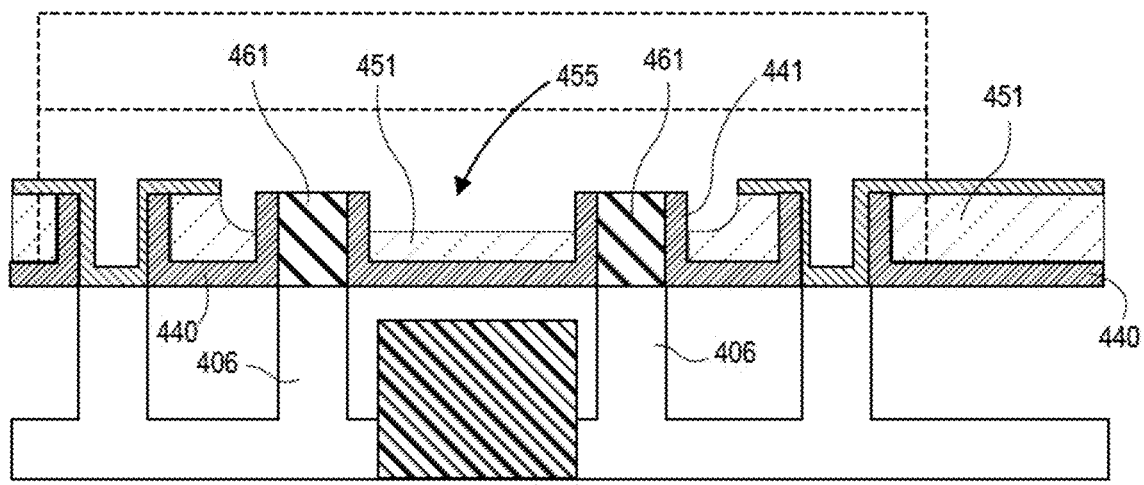
Figure 4P:
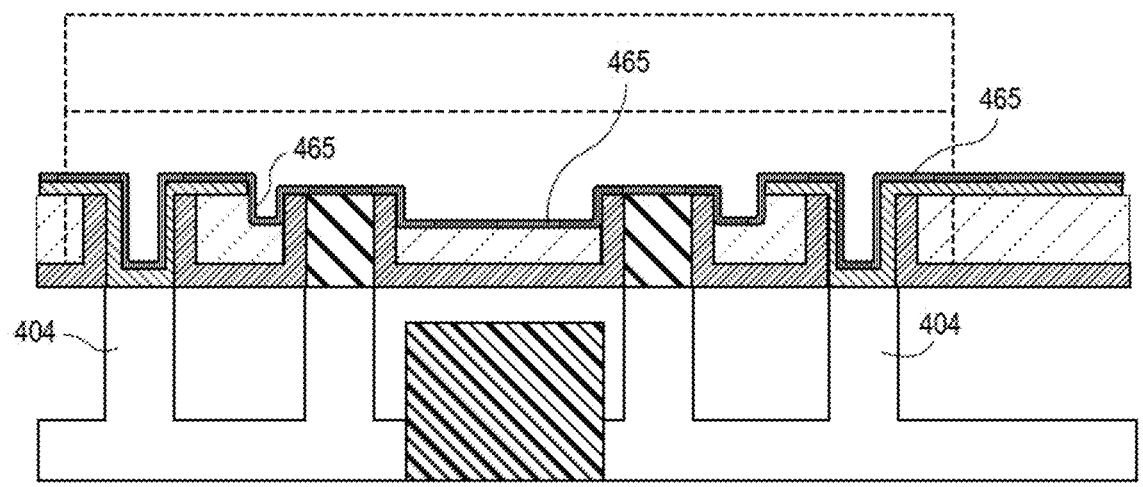
Figure 4Q:
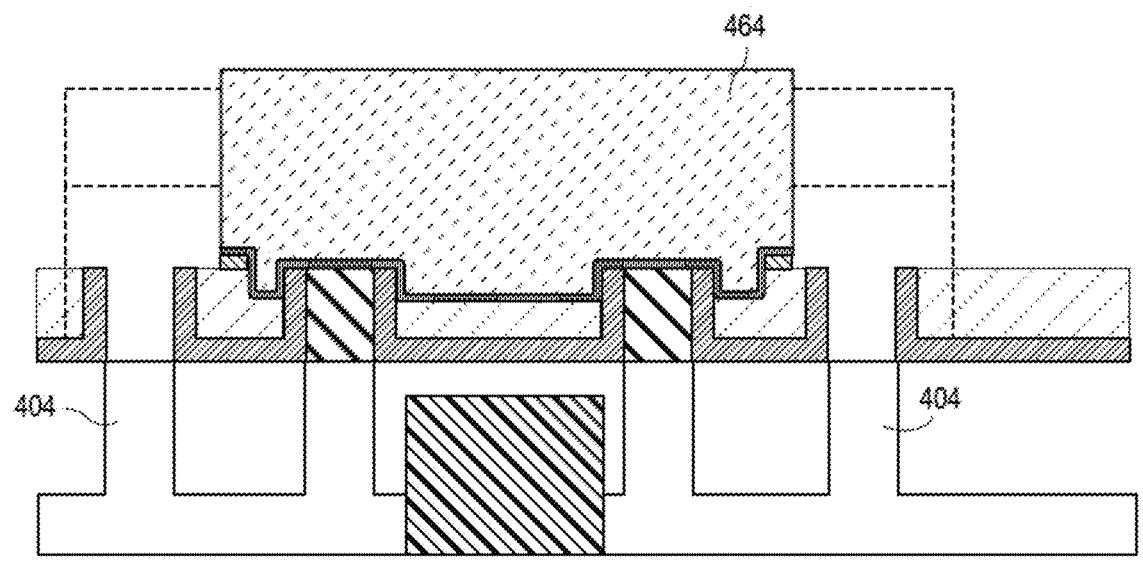
Figure 4R:
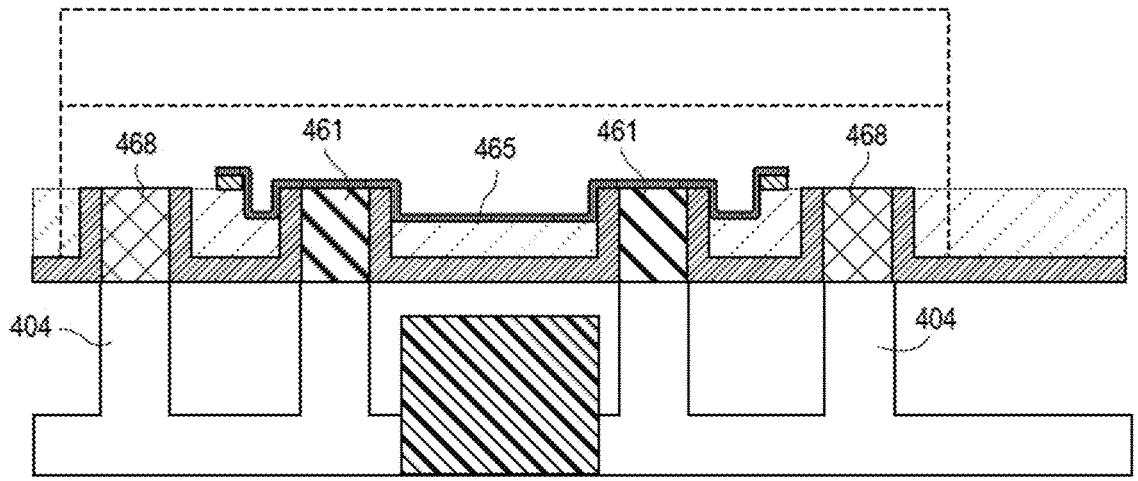
Figure 4S:
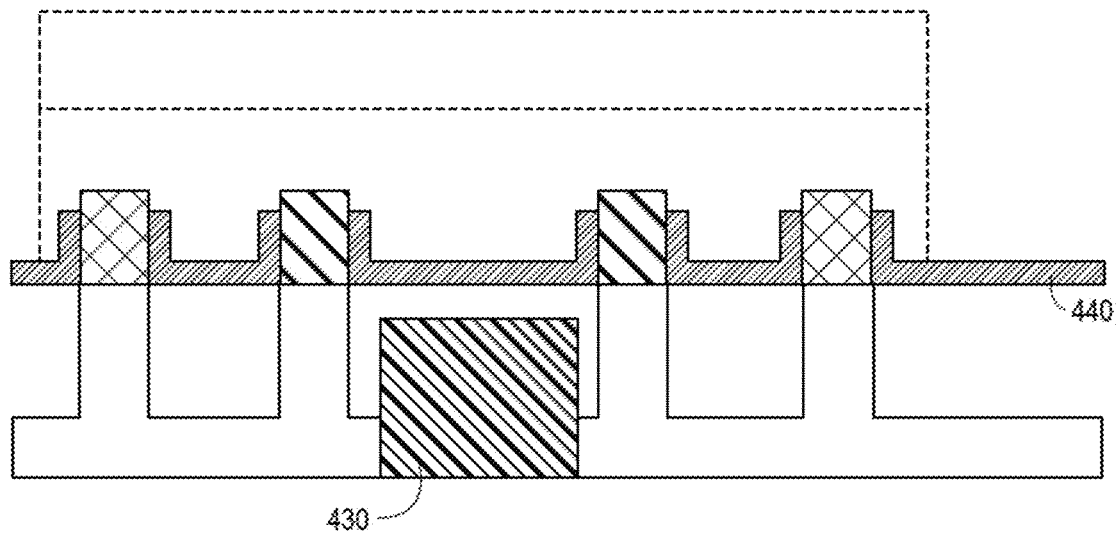
Figure 4T:
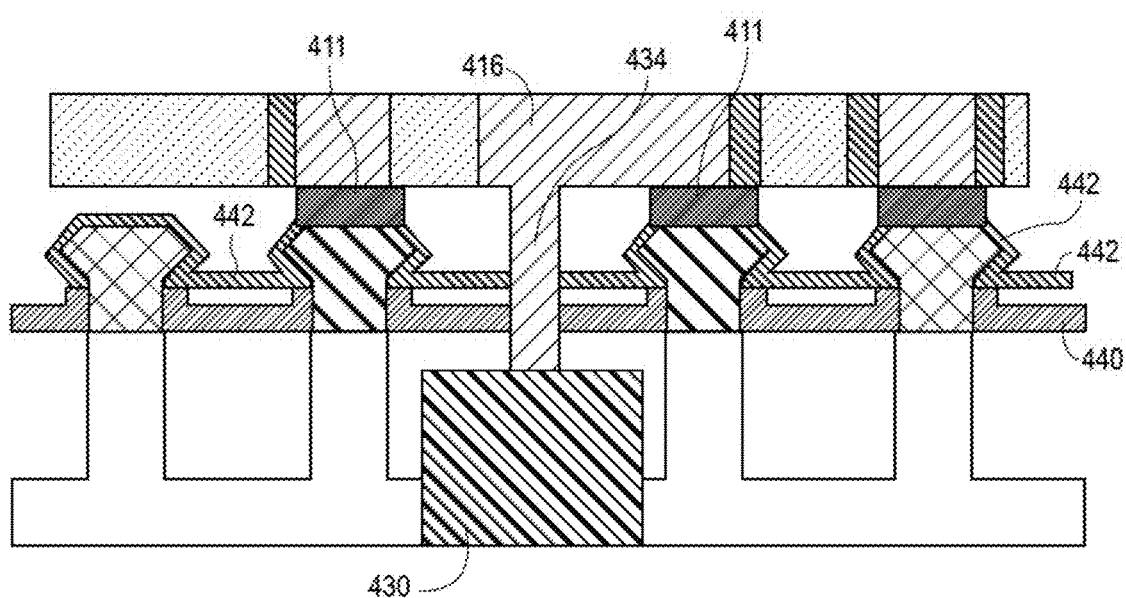

FIGS. 4A-4T illustrate various manufacturing stages for a BPR within a transistor structure that includes a protective layer to protect the BPR and to constrain growth of epitaxy, in accordance with various embodiments.

FIG. 4A shows a cross-section of a transistor structure that includes a layer 402, that is coupled with a plurality of fins 404, 406, that are within an oxide layer 431, which may be similar to layer 102, fins 104, 106, and oxide 132 of FIG. 1. A cap 405 made of a nitride may be placed on the top of the fins 404, 406. In embodiments, the fins 404, 406 and the layer 402 may include silicon. At this manufacturing stage, a cut 433 is made through oxide layer 431 and through the layer 402.

FIG. 4B shows the figure of FIG. 4A, where a metallization layer 435 is applied to the top of the transistor structure, filling the cut 433.

FIG. 4C shows the result of a chemical metal polish (CMP) to even a surface of the transistor structure and to remove excess metallization layer 435 from the top of the oxide layer 431 and the top of the nitride caps 405.

FIG. 4D shows the result of a metal etch of the metallization within the cut 433 to form the BPR 430, which may be similar to BPR 130 of FIG. 1, or 330 of FIG. 3. As discussed above, a height of the BPR 430 may be designed based upon distances between the BPR 430 a second trench connector, such as second trench connector 116, and the distances between the BPR 430 and the gate, such as metal gate 108 of FIG. 1. The resulting section of the BPR 430 also matters from both a resistance stand-point and the resulting current-carrying capability of the rail. If a larger section of BPR is needed, then cut 433 can be made deeper, as the location of the recess of metal 435, setting the top of the rail, is dictated by the minimum dielectric separation needed to the gate: A height of the BPR 430 is important, such that there is good electrical isolation between the BPR and the gate.

FIG. 4E shows the result of refilling the cut 433 with more dielectric 432 which may be similar to oxide layer 431, polishing this dielectric using the nitride fin caps as polish stop, then recessing the dielectric layer 432 using a non-selective etch that will also remove the nitride caps 405. In embodiments, the dielectric layer 432 is not etched away fully but recessed so that it still caps BPR 430: dielectric layer 432 is found at this stage between the fins 404, 406 and above the BPR 430. Note that in future manufacturing stages, the level of the dielectric layer 432 above the BPR 430 in embodiments will determine a distance between the BPR 430 and the metal gate, such as metal gate 108 of FIG. 1.

FIG. 4F shows the results of stages of a gate patterning scheme, that includes deposition of an amorphous silicon layer 437, that may be subsequently polished. A silicon nitride (SiN) cap 439 may then be placed on the amorphous silicon layer 437. A photolithographic process is then used to define a grating of parallel opening used to pattern a set of distinct gates into the amorphous silicon.

FIG. 4G shows a cross-section that is similar to the cross-section of FIG. 4F, except that the cross-section is at a different Y depth of the transistor structure between the gates. For clarity, outlines of the amorphous silicon layer 437 and the SiN cap 439 will be carried forward in subsequent figures for reference.

FIG. 4H shows a barrier layer 441, which may be similar to barrier layer 340 of FIG. 3, and may also be referred to at this stage as a gate spacer, has been deposited that coats the top of the dielectric layer 432 as well as the sides and top of the fins 404, 406. In embodiments, this barrier layer 441 will form the protective layer to protect the BPR 430.

In embodiments, the barrier layer 441 may be a dielectric, or may be a multilayer stack of different dielectrics. In embodiments, these different dielectrics may be chosen in a way to optimize the spacer structure for various functions, for example ensuring the critical dimension of the final gate length by encompassing a layer impervious to erosion by cleans in direct contact with the amorphous silicon gate. In embodiments, a carbon-rich oxide may be used to reduce the overall dielectric constant of the final spacer stack and limit the parasitic Miller capacitance of the device. In embodiments, the dielectric layers may include SiN, $SiO_2$, or silicon oxycarbon (SiOC). Other dielectrics may be used that include boron doping.

FIG. 4I shows an oxide layer 451 that is deposited to fill in gaps between the fins 404, 406. In embodiments, this deposition may be accomplished using a flowable chemical vapor deposited (FCVD) dielectric. Note that this material will flow, in a third dimension, over the various layers of the amorphous silicon layer 437 and the SiN cap 439.

FIG. 4J shows the result of a dry isotropic recess of the oxide layer 451. The top of the fins are now exposed, so are the gate caps.

FIG. 4K shows a result of a selective etch of a portion of the barrier layer 440 at the top of the fins 404, 406. Note that the resulting barrier layer 440 does not cover the top of the fins 404, 406 anymore. While selective to oxide dielectric 451, this etch may recess the SiN cap 439 of amorphous silicon layer 437.

FIG. 4L shows the result of a cavity etch 457 into the fins 404, 406. Note that this stage may involve the selective etch of silicon or silicon germanium (SiGe). Note that in embodiments this etch stage will not etch the dielectric. That means the gates, made of amorphous silicon but capped on all exposed sides by dielectric, will not be etched. Also, in embodiments, the oxide dielectric 451 remains between the walls of the barrier layer 440.

FIG. 4M shows a deposition of a second spacer 459 over the top layer of the transistor structure. In embodiments, the second spacer may be referred to as a spacer, a liner, or a hard mask This stage is a beginning stage of creating sources and drains as discussed further below.

FIG. 4N shows the placement of a photoresist layer 462 over the NMOS fins 404, and a removal using a selective etch of the second spacer 459 over the PMOS fins 406 where the photoresist had been removed.

FIG. 4O shows the result of the removal of the photoresist layer 462, and the result of a pre-clean etch to prepare the top of the PMOS fins 406 for epitaxial growth. Note that in embodiments, a portion 455 of the oxide layer 451 may be etched away during the pre-clean etching process. This pre-clean etching process is very important to thoroughly clean silicon surfaces for proper epitaxial growth.

A SiGe epitaxy 461 may then be grown on top of the PMOS fins 406. Note that the walls of the barrier layer 440, reinforced by the oxide dielectric layer 451, will constrain the growth of the epitaxy 461.

FIG. 4P shows the result of a deposition of a silicon nitride (SiN) hard mask 465. In embodiments, this may be a 2 nm to 3 nm silicon nitride.

FIG. 4Q shows a photoresist mask 464 applied, with the silicon nitride hard mask 465 removed and the second spacer 459 also removed where it is not covered by the photoresist mask 464. This opens the areas above the NMOS fins 404 for epitaxial growth.

FIG. 4R shows the photoresist 464 has been removed and silicon 468 epitaxy grown on the NMOS fins 404. Note that the SiGe epitaxy 461 has been protected by the silicon hard mask 465 during silicon 468 epitaxy growth. The epitaxied silicon may be doped with phosphorus (P) and may be referred as SiP.

FIG. 4S shows the silicon hard mask 465 removed selectively. Note that the BPR 430 has been fully protected by the barrier layer 440 during the succession of steps involved in the epitaxy module.

FIG. 4T, which may be similar to FIG. 3, shows a final stage where the material above the barrier layer 440 has been cleaned, and a contact etch stop layer (CESL) 442 has been placed. Note that portions of the CESL 442 may wrap around areas of epitaxial growth where the epitaxy has grown above walls of the barrier layer 440. A through via electrical connector 434, which may be similar to conducting via 334 of FIG. 3, is drilled through the barrier layer 440 and the CESL layer 442 to electrically couple the BPR 430 with a trench connector 416, which may be similar to second trench connector 316 of FIG. 3.

Figure 5:
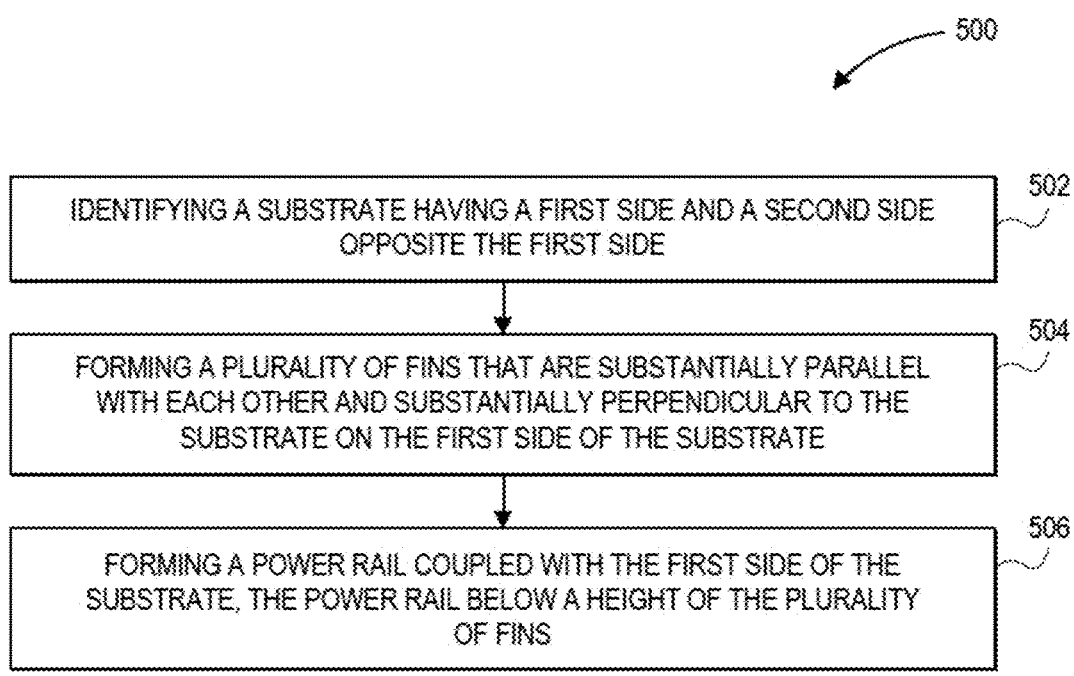
FIG. 5 illustrates an example process for manufacturing a transistor structure with a BPR, in accordance with various embodiments.

FIG. 5 illustrates an example process for manufacturing a transistor structure with a BPR, in accordance with various embodiments. Process 500 may be implemented by any one of the techniques or processes described herein, or in particular with respect to FIGS. 1-4.

At block 502, the process may include identifying a substrate having a first side and a second side opposite the first side.

At block 504, the process may further include forming a plurality of fins that are substantially parallel with each other and substantially perpendicular to the substrate on the first side of the substrate.

At block 506, the process may further include forming a power rail coupled with the first side of the substrate, the power rail below a height of the plurality of fins.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
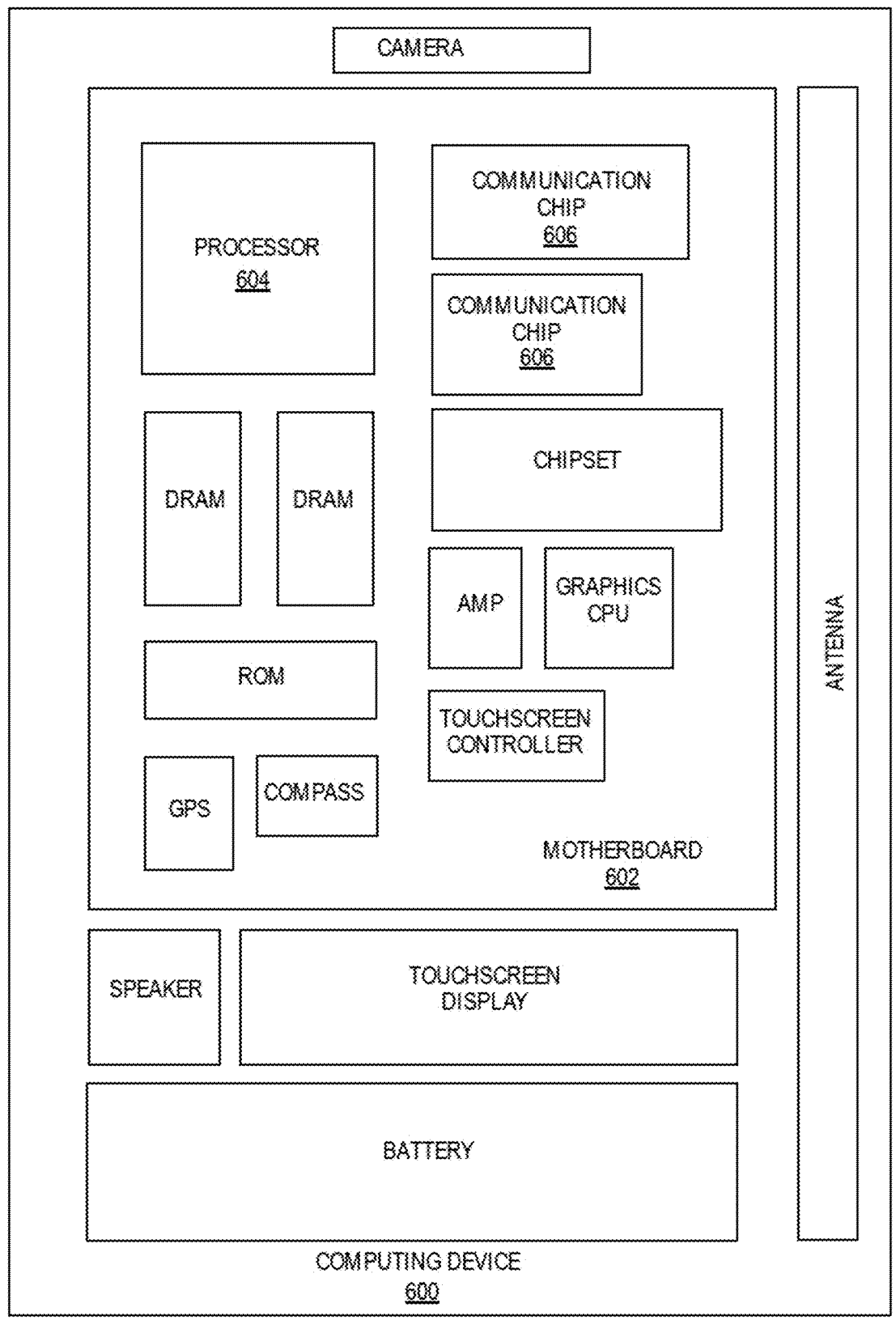
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
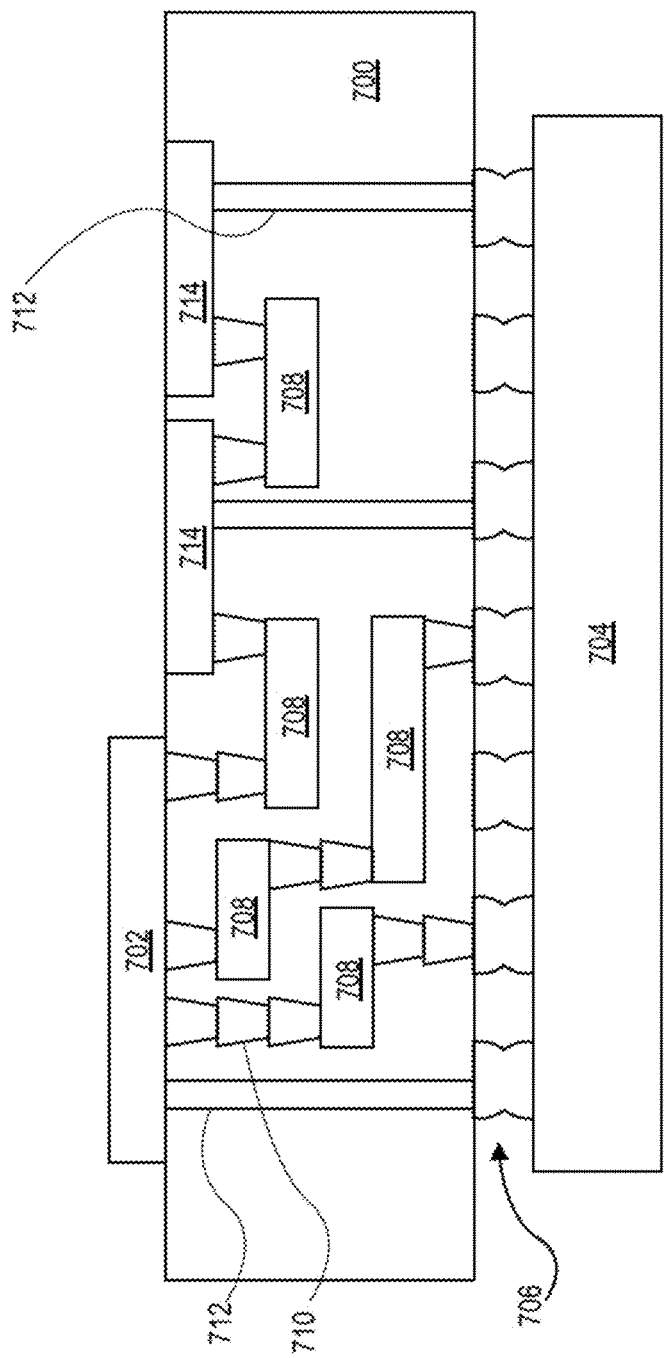
FIG. 7 illustrates an interposer that includes one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a transistor structure comprising: a substrate; a plurality of fins that are substantially parallel with each other and substantially perpendicular to the substrate; and a power rail located between the plurality of fins.

Example 2 includes the transistor structure of example 1, wherein the power rail is below a height of the plurality of fins.

Example 3 includes a transistor structure of example 1, wherein the plurality of fins include NMOS and PMOS fins.

Example 4 includes the transistor structure of example 1, wherein the power rail is surrounded by an oxide.

Example 5 includes the transistor structure of example 1, wherein the power rail is proximate to the substrate.

Example 6 includes a transistor structure of any one of examples 1-5, wherein the power rail is located between a barrier layer and the substrate, wherein the barrier layer protects the power rail during manufacture of the transistor structure.

Example 7 includes the transistor structure of example 6, wherein the barrier layer includes a dielectric.

Example 8 includes the transistor structure of example 6, further comprising an electrical contact electrically coupled to the power rail and extending through the barrier layer.

Example 9 includes the transistor structure of example 8, wherein the electrical contact is a through via structure or a through via bus structure.

Example 10 is a transistor structure comprising: a substrate; a plurality of fins that are substantially parallel with each other and substantially perpendicular to the substrate; a barrier layer above the substrate and substantially parallel to the substrate, wherein a portion of the barrier layer is substantially perpendicular to the substrate along sides of the plurality of fins wherein the barrier layer along the sides of the plurality of fins enclose part of an NMOS or PMOS epitaxy along a portion, respectively, of the plurality of fins.

Example 11 includes the transistor structure of example 10, further comprising a dielectric material coupled with a portion of barrier layer perpendicular to the substrate, wherein the dielectric material on an opposite side of the fin supports the portion of the barrier layer perpendicular to the substrate.

Example 12 includes the transistor structure of example 11, wherein the dielectric material on the opposite side of the fin supports the portion of the barrier layer perpendicular to the substrate during growth of the NMOS epitaxy or the PMOS epitaxy during transistor structure manufacture.

Example 13 includes the transistor structure of any one of examples 10-12, further comprising: a contact etch stop layer (CESL) above the barrier layer and substantially parallel with the barrier layer.

Example 14 includes the transistor structure of example 13, wherein a portion of the CESL is not parallel with the barrier layer and extends along a side of the NMOS epitaxy or a side of the PMOS epitaxy.

Example 15 includes the transistor structure of example 13, further comprising an electrical contact extending from above the CESL, through the CESL and through the barrier layer toward the substrate.

Example 16 includes the transistor structure of example 15, wherein the electrical contact is electrically coupled with a power rail on the substrate and below the barrier layer.

Example 17 is a method for creating a transistor structure, the method comprising: identifying a substrate having a first side and a second side opposite the first side; forming a plurality of fins that are substantially parallel with each other and substantially perpendicular to the substrate on the first side of the substrate; and forming a power rail coupled with the first side of the substrate, the power rail below a height of the plurality of fins.

Example 18 includes the method of example 17, further comprising: encasing the power rail within an oxide; and applying a barrier layer on the oxide and above the power rail, the barrier layer protecting the power rail during subsequent manufacture of the transistor structure.

Example 19 includes the method of example 18, further comprising: growing an NMOS epitaxy or a PMOS epitaxy on a top, respectively, of the plurality of fins; and depositing a contact etch stop layer (CESL) above the barrier layer, the CESL or the barrier layer at least partially surrounding the grown NMOS epitaxy or a PMOS epitaxy.

Example 20 includes the method of example 19, further comprising: forming a conductive through via extending from above the CESL, through the CESL and through the barrier layer toward the substrate; and electrically coupling the conductive through via to the power rail.

Example 21 is a transistor structure comprising: a substrate; a plurality of fins that are substantially parallel with each other and substantially perpendicular to the substrate; a power rail located between the plurality of fins wherein the power rail is below a height of the plurality of fins and surrounded by oxide; and wherein the plurality of fins include NMOS and PMOS fins, and wherein said power rail is located between a barrier layer and the substrate, wherein the barrier layer protects the power rail during manufacture of the transistor structure.

Example 22 includes the transistor structure of example 21, wherein the power rail is proximate to the substrate.

Example 23 includes the transistor of example 21 where the vertical separation between the top of the power rail and the underside of the barrier layer is in the range of 5 nm to 30 nm, or more narrowly in the range 10 nm to 20 nm Example 24 includes the transistor of example 21 where the vertical separation between the top of the power rail and the metal gates it is routed under is in the range 50 nm to 100 nm or more narrowly 70 nm to 80 nm.

Example 25 includes the transistor structure of example 21, wherein the barrier layer protecting the power rail during manufacture of the transistor structure is also constraining the epitaxial growth of the transistor sources and drains.

Example 26 includes the transistor structure of example 25, further comprising an electrical contact electrically coupled to the power rail and extending through the barrier layer.

Example 27 includes the transistor structure of example 25 where the barrier layer is a silicon nitride dielectric film.

Example 28 includes the transistor structure of example 25 wherein the conductive via includes Ruthenium or Molybdenum.

Example 29 includes the transistor structure of example 25 where the minimum separation between fins is smaller than 28 nm.

Example 30 is a transistor structure comprising: a substrate; a plurality of fins that are substantially parallel with each other and substantially perpendicular to the substrate; a barrier layer above the substrate and substantially parallel to the substrate, wherein a portion of the barrier layer is substantially perpendicular to the substrate along sides of the plurality of fins wherein the barrier layer along the sides of the plurality of fins enclose part of an NMOS or PMOS epitaxy along a portion, respectively, of the plurality of fins.

Example 31 includes the transistor structure of example 30 further comprising a dielectric material coupled with a portion of barrier layer perpendicular to the substrate, wherein the dielectric material on an opposite side of the fin supports the portion of the barrier layer perpendicular to the substrate.

Example 32 includes the transistor structure of example 30, wherein the dielectric material on the opposite side of the fin supports the portion of the barrier layer perpendicular to the substrate during growth of the NMOS epitaxy or the PMOS epitaxy during transistor structure manufacture.

Example 33 includes the transistor structure of example 30, further comprising: a contact etch stop layer (CESL) above the barrier layer and substantially parallel with the barrier layer.

Example 34 includes the transistor structure of example 33, wherein a portion of the CESL is not parallel with the barrier layer and extends along a side of the NMOS epitaxy or a side of the PMOS epitaxy.

Example 35 includes the transistor structure of example 33, further comprising an electrical contact extending from above the CESL, through the CESL and through the barrier layer toward the substrate.

Example 36 includes the transistor structure of example 35, wherein the electrical contact is electrically coupled with a power rail on the substrate and below the barrier layer.

Example 37 includes the transistor structure of example 35 where the electrical contact is made of a low resistivity metal Ruthenium or Molybdenum.

Example 38 is a method for creating a transistor structure, the method comprising: identifying a substrate having a first side and a second side opposite the first side; forming a plurality of fins that are substantially parallel with each other and substantially perpendicular to the substrate on the first side of the substrate; and forming a power rail coupled with the first side of the substrate, the power rail below a height of the plurality of fins.

Example 39 includes the method of example 38, further comprising: encasing the power rail within an oxide; and applying a barrier layer on the oxide and above the power rail, the barrier layer protecting the power rail during subsequent manufacture of the transistor structure.

Example 40 includes the method of example 39, further comprising: growing an NMOS epitaxy or a PMOS epitaxy on a top, respectively, of the plurality of fins; and depositing a contact etch stop layer (CESL) above the barrier layer, the CESL or the barrier layer at least partially surrounding the grown NMOS epitaxy or a PMOS epitaxy.

Example 41 includes the method of example 40, further comprising: forming a conductive through via extending from above the CESL, through the CESL and through the barrier layer toward the substrate; and electrically coupling the conductive through via to the power rail.

What is claimed is:
1. A transistor structure comprising:
   a substrate having a bottommost surface;
   a plurality of fins that are substantially parallel with each other and substantially perpendicular to the substrate;
   a trench isolation structure laterally between adjacent ones of the plurality of fins, the trench isolation structure having a bottommost surface at a same level as a bottommost surface of the plurality of fins; and
   a power rail located between a first fin and a second fin of the plurality of fins and in a portion of the trench isolation structure, the power rail having a bottommost surface below a bottommost surface of the plurality of fins, the bottommost surface of the power rail at a same level as the bottommost surface of the substrate.

2. The transistor structure of claim 1, wherein the power rail is below a height of the plurality of fins.

3. The transistor structure of claim 1, wherein the plurality of fins include NMOS and PMOS fins.

4. The transistor structure of claim 1, wherein the power rail is surrounded by an oxide.

5. The transistor structure of claim 1, wherein the power rail is proximate to the substrate.

6. The transistor structure of claim 1, wherein the power rail is located between a barrier layer and the substrate, wherein the barrier layer protects the power rail during manufacture of the transistor structure.

7. The transistor structure of claim 6, wherein the barrier layer includes a dielectric.

8. The transistor structure of claim 6, further comprising an electrical contact electrically coupled to the power rail and extending through the barrier layer.

9. The transistor structure of claim 8, wherein the electrical contact is a through via structure or a through via bus structure.

10. A transistor structure comprising:
a substrate having a bottommost surface;
a plurality of fins that are substantially parallel with each other and substantially perpendicular to the substrate;
a trench isolation structure laterally between adjacent ones of the plurality of fins, the trench isolation structure having a bottommost surface at a same level as a bottommost surface of the plurality of fins;
a barrier layer above the substrate and substantially parallel to the substrate, wherein a portion of the barrier layer is substantially perpendicular to the substrate along sides of the plurality of fins wherein the barrier layer along the sides of the plurality of fins enclose part of an NMOS or PMOS epitaxy along a portion, respectively, of the plurality of fins; and
a power rail below the barrier layer, the power rail located between a first fin and a second fin of the plurality of fins and in a portion of the trench isolation structure, the power rail having a bottommost surface below a bottommost surface of the plurality of fins, the bottommost surface of the power rail at a same level as the bottommost surface of the substrate.

11. The transistor structure of claim 10, further comprising a dielectric material coupled with a portion of barrier layer perpendicular to the substrate, wherein the dielectric material on an opposite side of the fin supports the portion of the barrier layer perpendicular to the substrate.

12. The transistor structure of claim 11, wherein the dielectric material on the opposite side of the fin supports the portion of the barrier layer perpendicular to the substrate during growth of the NMOS epitaxy or the PMOS epitaxy during transistor structure manufacture.

13. The transistor structure of claim 10, further comprising:
a contact etch stop layer (CESL) above the barrier layer and substantially parallel with the barrier layer.

14. The transistor structure of claim 13, wherein a portion of the CESL is not parallel with the barrier layer and extends along a side of the NMOS epitaxy or a side of the PMOS epitaxy.

15. The transistor structure of claim 13, further comprising an electrical contact extending from above the CESL, through the CESL and through the barrier layer toward the substrate.

16. The transistor structure of claim 15, wherein the electrical contact is electrically coupled with the power rail.

17. A method for creating a transistor structure, the method comprising:
providing a substrate having a first side and a second side opposite the first side;
forming a plurality of fins that are substantially parallel with each other and substantially perpendicular to the substrate on the first side of the substrate;
forming a trench isolation structure laterally between adjacent ones of the plurality of fins, the trench isolation structure having a bottommost surface at a same level as a bottommost surface of the plurality of fins; and
forming a power rail coupled with the first side of the substrate, the a power rail located between a first fin and a second fin of the plurality of fins and in a portion of the trench isolation structure, the power rail below a height of the plurality of fins, and the power rail having a bottommost surface below a bottommost surface of the plurality of fins, the bottommost surface of the power rail at a same level as the second side of the substrate.

18. The method of claim 17, further comprising:
encasing the power rail within an oxide; and
applying a barrier layer on the oxide and above the power rail, the barrier layer protecting the power rail during subsequent manufacture of the transistor structure.

19. The method of claim 18, further comprising:
growing an NMOS epitaxy or a PMOS epitaxy on a top, respectively, of the plurality of fins; and
depositing a contact etch stop layer (CESL) above the barrier layer, the CESL or the barrier layer at least partially surrounding the grown NMOS epitaxy or a PMOS epitaxy.

20. The method of claim 19, further comprising:
forming a conductive through via extending from above the CESL, through the CESL and through the barrier layer toward the substrate; and
electrically coupling the conductive through via to the power rail.

\* \* \* \* \*